United States Patent [19]

Thomas et al.

[11] 3,808,004

[45] Apr. 30, 1974

[54] LITHOGRAPHIC PLATE AND PHOTORESIST HAVING TWO PHOTOSENSITIVE LAYERS

[75] Inventors: Daniel C. Thomas, Covina, Calif.; Jack L. Sorkin, University Heights, Ohio

[73] Assignee: Richardson Graphics Company, Chicago, Ill.

[22] Filed: May 29, 1969

[21] Appl. No.: 829,149

[52] U.S. Cl. .......... 96/68, 96/33, 96/35.1, 96/36, 96/36.2, 96/36.3, 96/75, 96/86 P, 96/115 R

[51] Int. Cl. .......... G03c 1/52, G03c 1/68, G03f 7/08

[58] Field of Search .......... 96/33, 68, 36, 35.1, 115, 96/75

[56] References Cited

UNITED STATES PATENTS

| | | | |
|---|---|---|---|
| 3,622,331 | 11/1971 | Thomas | 96/68 |
| 3,652,272 | 3/1972 | Thomas | 96/33 |
| 3,136,637 | 6/1964 | Larson | 96/75 |
| 3,173,787 | 3/1965 | Clement | 96/36.3 |
| 3,376,139 | 4/1968 | Giangualano | 96/36 |
| 3,387,976 | 6/1968 | Sorkin | 96/35.1 |
| 3,462,267 | 8/1969 | Giangualano | 96/33 |

*Primary Examiner*—Charles L. Bowers, Jr.
*Attorney, Agent, or Firm*—John L. Hutchinson; Alan M. Abrams

[57] ABSTRACT

A photopolymerizable coating over a diazo resin provides a surprisingly high-speed lithographic plate or photoresist, while also improving the printing life of the plate and further making its development simpler than that of most photopolymer plates. The photopolymer is either a cinnamoylated resin or an alkyd.

2 Claims, No Drawings

LITHOGRAPHIC PLATE AND PHOTORESIST HAVING TWO PHOTOSENSITIVE LAYERS

This invention relates to an improved presensitized lithographic plate and to an improved method for making lithographic plates. It also relates to an improved photoresist and to a method for making photoresists.

Lithographic plates of this invention are characterized by a remarkably rapid exposure speed; they are ten times as fast as either emulsion-developed diazo resin plates currently in use or currently used solvent-developed photopolymer plates, and they are fifty to one hundred times as fast as emulsion-developed photopolymer plates.

Plates of this invention are also characterized by being very long-running on presses, — as long running as conventional photopolymer plates and longer running than conventional lacquered diazo resin plates.

The plates of this invention are also characterized by a moisture barrier protective coating which protects the photosensitive material from damage in handling.

Another feature of plates of this invention is that they are easily and rapidly developed, — as easily and as fast as are conventional diazo resin plates and by an emulsion developer normally used to develop those diazo resin plates.

The leading presensitized lithographic types of plates heretofore in use can be classed as either diazo resin plates or as photopolymer plates. Plates that are presensitized with a diazo resin are, in some cases, not further coated and in other cases receive a lacquer coating and so are known as prelacquered diazo plates.

Each of these three types of presensitized lithographic plates, — unlacquered diazo, prelacquered diazo, and photopolymer — has its advantages and disadvantages. For example, both the uncoated and the prelacquered diazo-type plates have a moderately rapid light-exposure speed, being much faster than the photopolymer plates. Also, uncoated diazo plates are relatively insensitive to rubbing during development. However, the uncoated diazo plate is only fair in its resistance to handling, is quite sensitive to moisture, and has a relatively short shelf life as compared with either the prelacquered diazo plates or the photopolymer plates. Also, it has a relatively short run length, unless lacquered after development.

The prelacquered diazo plates, while being better in the resistance to handling than the unlacquered diazo plates, are sensitive to rubbing during development. They are, however, somewhat less sensitive to moisture, have a better storage life than the uncoated diazo plates and have a relatively long press run.

Photopolymer plates are very good for long press runs and have good resistance to handling damage. They are insensitive to moisture and have a good shelf life. However, their light-exposure speed is very slow, so that the processing time is prolonged. Also, photopolymer plates are sensitive to rubbing during development; therefore, emulsion development is difficult, and they cannot be developed with aqueous developer alone, so that dipping them in solvent or exposing them to vapors of solvents is practically a necessity, and this, of course, is not only inconvenient but the solvents required introduce hazards to health and safety.

The plates of the present invention have a remarkably fast light speed while still being as resistant to handling damage as are photopolymer plates, and at the same time development by the emulsion process is quite simple. They are capable of long press runs, very long if subsequently lacquered, being at least as good as the photopolymer plates heretofore in use. They are only moderately sensitive to moisture or time and have good resistance to handling damage.

The invention comprises taking a conventional unexposed and unlacquered diazo resin plate and coating it with a photopolymer rather than with a lacquer, the photopolymer being either a cinnamoylated resin or an alkyd. The results are quite surprising. Photospeeds are increased (exposure times are reduced) by an order of magnitude over the diazo resin plate, while enhancement of most other qualities is also obtained.

Other objects and advantages of the invention will appear from the following description of some preferred embodiments.

The invention comprises a plate made by using a negative-working diazo resin plate, substantially as has been conventional or typical and then coating the diazo resin, not with a lacquer, but with a photopolymer. The photopolymer must be either a cinnamoylated resin or an alkyd. The result has been astonishing in terms of reducing the exposure times required, the emulsion-developed plate of this invention having photospeeds ten times as great as emulsion-developed diazo resin plates or solvent-developed photopolymer plates and fifty to one hundred times as great as emulsion-developed photopolymer plates.

Diazo compounds have a moderate light speed. For example, an exposure time of two minutes to a 1000–1200 foot candle xenon arc. The diazo plate photospeed is increased somewhat when the plate is prelacquered, and shorter exposure times then become possible, e.g., 1½ minutes for the same light. Photopolymer plates are slow compared with either unlacquered or prelacquered diazo plates, requiring about ten to twenty minutes for the same light, if emulsion developed, or about two minutes if solvent developed. For contrast, the plate of this invention requires an exposure time of only about ten seconds to the same light.

We have found that the thinner the photopolymer overcoat film, the faster the exposure speed; and the thinner the diazo film, the faster the exposure speed.

The plate may have a backing of aluminum or zinc or paper or plastic sheet or other materials. The plate must be treated to provide a hydrophilic surface, before application of the diazo resin; also, the diazo resin needs protection from direct contact with the metal. Preferably, then, the plate is coated with a sub-layer or subbase. Many of them are available, each with its own advantages and disadvantages. Suitable subbases, thus, include the phytic acid subbase of U.S. Pat. No. 3,307,951, the melamine-formaldehyde condensation resin overcoated with a polyacrylamide, treated with zirconium acetate as in U.S. Pat. No. 3,073,723, the urea-formaldehyde subbase of U.S. Pat. No. 3,136,636, the titanium ortho ester subbase of U.S. Pat. No. 3,231,376, the silane-acrylic subbase of U.S. Pat. No. 3,163,534, the silicate subbase of U.S. Pat. No. 2,714,066, and the volan-acrylic subbase of U.S. Pat. No. 3,261,285. In addition, other subbases are also satisfactory for many uses, including gelatin, polyacrylic acid and water-soluble salts thereof, polymethacrylic acid and water-soluble salts thereof, carboxymethyl cellulose, carboxymethyl hydroxyethyl cellulose, some titanates, modified resins of urea-formaldehyde and melamine-formaldehyde, polyvinyl alcohol, ferrocyanides or bichromates of sodium, potassium, and ammonium, and the oxide of a metal forming the plate. Combinations of these are also suitable. Typical diazo resin sensitizers which are ideally suited for use in the preparation of presensitized negative-working lighographic printing plates are described in U.S. Pat. Nos. 2,100,063; 2,667,415; 2,679,498 and 2,958,599. A preferred diazo resin of the negative-working type is prepared by condensing paraformaldehyde with p-diazo-diphenylamine sulfate as set forth in U.S. Pat. No. 2,100,063. The dispersion or solution of the sensitizer or light-sensitive material may be applied to the prepared base, over the subbase, by dipping, spraying, roller coating, brushing, or the like, all of which are conventional in this art.

In photographic and graphic arts technology, photopolymerization has been used as a general term to describe changes produced in polymeric or plastic materials by light, usually in conjunction with a mask, to produce a desired image or pattern. A common characteristic of all photopolymerization processes is the conversion of low molecular weight unsaturated organic components into higher molecular weight polymers.

Considering processes in which molecular weight increases, it is possible to divide photopolymerization processes into three principal classes. The one most properly called photopolymerization by chemists is the light-induced reaction by which many monomer molecules are joined to form very large, essentially linear polymer molecules. A second, related polymerization process is photocrosslinking in which a preformed polymer, such as a polyamide containing pendant monomer groups, is cross-linked to form a higher molecular weight polymer. The third commonly used method of increasing molecular weight of unsaturated molecules by light exposure is photodimerization. Here also, molecules of a preformed polymer containing unsaturated groups combine to form larger molecules. The reaction is illustrated by linear polymers containing pendant cinnamoyl groups. A common feature of all three systems, as they are used today, is the formation of some cross-linked polymers. Cross-linking usually has a greater effect on polymer solubility than on other physical or chemical properties. Hence, the two current applications for photopolymer products in the graphic arts, namely, printing plates and photoresists, both use solubility differences to develop images.

Various photopolymers may be used in this invention; in fact, any photopolymer usable in lithography may be used for this purpose. Vinyl cinnamates (such as Kodak Photo Resist), phenoxy cinnamates, alkyd resins, the allyl esters of U.S. Pat. No. 3,376,138, and several other photopolymers have been tried, as will be seen in the following examples. Several of these photopolymers are, in themselves, believed to be novel, and are described in pending patent applications. For them, sufficient details of their preparation for the present application are given to enable practice of the invention.

EXAMPLE 1

High-Speed Plate with Diazo Resin Overcoated with Phenoxy-Cinnamate Photopolymer An aluminum sheet of sufficiently low gauge to be readily flexed was cleaned of surface grease and other contaminates by being immersed for two minutes in an aqueous solution of trisodium phosphate maintained at 160°F. Thereafter, the plate was washed for two minutes with tap water and subsequently immersed for another two-minute period in a desmutting bath of concentrated nitric acid (20 to 70 percent).

Following another two-minute rinse of the plate with tap water, a protective sub-layer was applied to the working surface. The plate was first immersed for two minutes in a 0.55 percent aqueous solution of a water-soluble melamine-formaldehyde condensation resin. The plate was again washed with tap water for two minutes. Although the condensation resin is water-soluble, a sufficient quantity remains (possibly due to electrostatic attraction) for subsequent operations. Next a polyacrylamide, sold under the trade name CYANAMER, and having 70 percent carboxyl groups and 30 percent carboxamide groups was applied by dipping the plate in a 0.01 percent aqueous solution of the polymer for two minutes. After a further rinse in a water bath for two minutes, the plate was dipped for an additional two minutes in a 0.1 percent aqueous solution of zirconium acetate. The plate was once more washed for two minutes by tap water and then given a final wash with de-ionized water and dried. The foregoing applied an impervious sub-layer over the aluminum sheet.

Next, the plate, prepared as so far described, was immersed in a 3.0 percent aqueous solution of a condensation product of paraformaldehyde with p-diazo-diphenylamine sulfate plus 0.75 percent zinc chloride stabilizer and then passed between rollers and dried, thus, forming a diazo presensitized negative-working lithographic plate as described in U.S. Pat. No. 3,073,723.

Part of the above plate was then dip-coated over the diazo resin with 2.5 percent phenoxy-cinnamate photopolymer (described in U.S. Pat. No. 3,387,976, and all the plate was then dip-coated with 0.05 percent Michler's Ketone in xylene. The plate was then air dried, to form a single plate having in one area a presensitized lighographic negative-working diazo resin control section and in another area a presensitized lighographic high-speed negative-working diazo-photopolymer section, formed by overcoating the negative diazo presensitized plate with the photopolymer. The plate was covered with a negative transparency and was exposed for 10 seconds to a xenon arc at 1000–1200 foot candles.

The plate was then emulsion-developed using the commercial developing lacquer described in U.S. Pat. application Ser. No. 526,350, now U.S. Pat. No. 3,455,688, and desensitized with a commercial desensitizer. The negative-working diazo control section had weak image areas (due to incomplete exposure) and clean background areas. The negative-working high-speed diazo-photopolymer section of the plate had strong image areas and clean background areas. The high-speed negative-working diazo-photopolymer section had a photospeed more than six times the speed of the negative-working diazo resin control section, as was evidenced by the presence of five additional steps on the Eastman Kodak No. 2 Photographic Step Tablet, in the photopolymer overcoated high-speed diazo-photopolymer sections of the plate.

The plate was printed on a lithographic printing press for 35,000 copies in the high-speed diazo-photopolymer overcoated areas before loss of the fine halftones (300 line screen – 20 percent dots). The negative diazo control section was weak from the start.

EXAMPLE 2

Diazo Resin Overcoated with Polyvinyl Cinnamate Photopolymer

A presensitized negative-working diazo plate, produced as per Example 1 above, was partially dip-coated with Kodak PhotoResist, a polyvinyl cinnamate, (Eastman Kodak Company, see U.S. Pat. No. 2,610,120) and air dried to form a presensitized high-speed negative-working diazo-photopolymer section of the plate and a negative-working diazo control plate section which had not been overcoated with photopolymer as above.

The negative diazo control section of the plate was exposed for 2 minutes and developed as in Example 1. The high-speed diazo-photopolymer plate sections were exposed for 10 seconds, 30 seconds, and 2 minutes and were developed as in Example 1.

The plate was printed on a lithographic printing press for 15,000 copies before loss of fine halftones in the negative diazo control section of the plate and for 70,000 copies in all the hi-speed diazo-photopolymer overcoated areas, regardless of exposure, before loss of fine halftones (300 line – 20 percent dots).

EXAMPLE 3

Diazo Resin Overcoated with Vinyl Chloride-Vinyl Acetate Cinnamate Photopolymer.

A typical vinyl resin that may be used in this photopolymer contains 87 percent vinyl chloride groups, 13 percent vinyl acetate groups, and no hydroxyl groups. This distinctive feature contrasts with the photopolymers of U.S. Pat. Nos. 2,725,372 and 3,387,976, which are formed by attaching the cinnamate radical to the polymer backbone through reaction with hydroxyl groups. Bakelite vinyl resin VYHH, one of the most widely used surface coating vinyl-chloride acetate resins, has a medium molecular weight of about 50,000, and a chemical composition of approximately 87 percent vinyl chloride and 13 percent vinyl acetate. These properties have been found to give a desirable balance between chemical resistance, solubility, film strength, and thermoplasticity. Films of these resins are not attacked at normal temperatures by alkalies, mineral acids, alcohols, greases, oils, or aliphatic hydrocarbons.

10 grams of Bakelite Vinyl Resin VYHH (87 percent vinyl-chloride groups and 13 percent vinyl acetate groups, a dry white powder) and 10 grams of cinnamoyl chloride, were placed in a beaker and 30 cc. of n-methyl-2-pyrrolidone and 30 cc. of Carbitol acetate (diethylene glycol monoethyl ether acetate) were added. The mixture was heated to 80°C. to dissolve the resin and then heated to 100°–122°C. for one hour. After cooling, the reaction product was precipitated in 200 ml. of methanol, then treated with hot water, methanol, hot water again, methanol again, and then dried. The yield was 12.2 grams.

The resulting vinyl chloride-vinyl acetate cinnamate of this example has been used on a ball grained aluminum plate to make a negative-working lithographic plate that was exposed and developed to give printable images.

The cinnamate polymer of this example has also been used to make a presensitized negative-working diazo-photopolymer plate of the present invention by coating it over the negative-working diazo plate prepared as in Example 1. Although the vinyl chloride-vinyl acetate cinnamate polymer by itself was found to have a photospeed slower than the phenoxy-cinnamate polymer of Example 1 on emulsion-developed ball grained plates, the vinyl chloride-vinyl acetate cinnamate polymer negative-working diazo-photopolymer plate has a very fast photospeed that is comparable to the high-speed phenoxy-cinnamate negative-working diazo-photopolymer plates of Example 1. The resulting developed diazo-photopolymer plate of this example had a press run length of 30,000 copies, in comparison with press run length of 10,000 for the diazo control section of the same plate.

EXAMPLE 4

Diazo Resin Overcoated with Bisphenol-A Fumarate Polyester Cinnamate Photopolymer The photopolymer of this example uses as one of its starting materials a resin made by reacting a bisphenol derivative, such as bisphenol-A with furmaric acid. The chemical structure of this resin imparts superior resistance to water, acids, and bases, particularly at elevated temperatures. As a result, it has a higher heat distortion temperature, about 285°F., than do conventional polyesters. The same material has excellent electrical properties, particularly after exposure to high humidity, which enables the product of this invention to be of use in making printed circuits. The base resin also has significant temperature-viscosity-gelation characteristics which give it good strength.

These resins are sold under the trademark Atlac in several different types, some of which are as follows:

PROPERTIES OF ATLAC RESINS

| | ATLAC 382E | ATLAC 382–13 | ATLAC 382–2 | ATLAC 382–05 |
|---|---|---|---|---|
| Resin-Styrene Ratio | Solid | 67/33 | 60/40 | 50/50 |
| Viscosity (cps) 23°C | — | 13,000 ± 2,000 | 2,300 ± 200 | 500 ± 100 |
| Acid No. of liquid | Max. 27 | Max. 18 | Max. 16 | Max. 14 |
| Color | Amber | Amber | Amber | Amber |
| Specific Gravity | — | 1.08 | 1.06 | 1.03 |
| Storage life at 75°F | 2 yrs. or more | 6 mos. | 6 mos. | 6 mos. |
| Physical form | 40 mesh powder | liquid | liquid | liquid |
| Softening point | 106°C. max. | — | — | — |
| Catalyzed shelf life at 75°F | | | | |
| 1% BPO | — | 3 wks. | 3 wks. | 3 wks. |
| 1% TBPB | — | 3 mos. | 3 mos. | 3 mos. |
| 1% MEKP | — | 1 wk. | 1 wk. | 24 hrs. |

ATLAC 382 resin has an acid number of 20, which is an indication that free carboxyl groups are present in the resin. This resin reacts with cinnamoyl chloride to form a photopolymer. Probably the reaction is a displacement of the terminal fumeric acid groups.

As an example of the photopolymer, 10 grams of Atlac 382E, 10 grams of cinnamoyl chloride, and 30 cc. of n-methyl-2-pyrrolidone are added to a 250 ml. beaker and heated to 112°C. to dissolve the resin. Then the reaction mixture is heated at 112°C.–124°C. for one hour. The bisphenol-A fumarate polyester cinnamate reaction product is precipitated by the methanol and water process described in Example 3, washed several times with methanol and water to remove cinnamoyl chloride, and then dried.

The photopolymer of this example has been used successfully on ball grained aluminum plates to make a presensitized negative-working lithographic printing plate; it gave a good strong image upon exposure and development. This photopolymer has also been used to make a resist for printed circuit boards.

The photopolymer of this example has also been used to make a presensitized negative-working diazo-photopolymer plate by overcoating a negative-working diazo plate (prepared as in Example 1 and 2) with the photopolymer. It gave good results with ten-second exposures, and gave a press run of 42,000 copies, whereas the control portion of the same plate (uncoated diazo resin) gave only a press run of 15,000 copies.

EXAMPLE 5

Diazo Resin Overcoated Polycarbonate-Cinnamate Photopolymer

A polycarbonate-cinnamate photopolymer is made by reacting a polycarbonate resin with a cinnamoylating agent such as cinnamoyl chloride in the presence of a solvent and subsequently precipitating the polycarbonate-cinnamate from the solvent.

Polycarbonate resins such as are sold under the trademark LEXAN make transparent, clear films that are thermoformable, heat-sealable, strong, tough and strain-resistant. They also have good solvent resistance and excellent corrosion resistance. The polycarbonate resins used as one of the starting materials for this invention have molecular weights from about 20,000 to about 50,000. The basis for such polycarbonates may be monomeric bisphenol-A, which is also known as 2, 2-bis(4-hydroxy phenyl)propane. Also, there are the polyaryl carbonates, which are a special variety of polyesters in which carbonic acid is substituted for the more conventional adipic acid or sebacic acid or phthalic acid, and also a diphenol is substituted for more conventional glycols. Bisphenol-A polycarbonate resins have terminal hydroxyl groups which we have found may be cinnamoylated by the use of any of several presently available cinnamoylating compounds containing the cinnamoyl radical and capable of attaching to the polymer through reaction with hydroxyl groups.

As an example, 12 grams of "LEXAN" Polycarbonate Film (8 inches × 10 inches × 7.5 mils thick) is added to 50 cc. of n-methyl-2-pyrrolidone in a 250 ml. beaker, and the mixture is heated for one hour at 115°C. to dissolve the polycarbonate resin. Then, 12 grams of cinnamoyl chloride are added to the dissolved polycarbonate resin and heating continued for one hour at 100°–110°C. to effect the reaction. The polycarbonate-cinnamate reaction product is then precipitated and washed in methanol several times to remove cinnamoyl chloride and then dried.

The polycarbonate-cinnamate of this example has been used on ball grained aluminum plates to make presensitized negative-working polycarbonate-cinnamate photopolymer lithographic printing plates, exposed ten minutes and developed to give a usable image.

In addition, the polycarbonate-cinnamate photopolymer of this example has been used to make a presensitized negative-working diazo photopolymer plate by overcoating a negative-working diazo plate (as in Examples 1 and 2) with polycarbonate-cinnamate photopolymer. The polycarbonate-cinnamate photopolymer has a photospeed somewhat slower than some other photopolymers but when added to the diazo gave good images with only ten-second to sixty-second exposure to a xenon arc lamp. At ten-seconds, when developed as in Example 1, it gave a press run of 21,000 copies.

EXAMPLE 6

Diazo Resin Overcoated with Polyurethane-Cinnamate Photopolymer

A polyurethane-cinnamate photopolymer may be made by reacting a polyurethane resin with a cinnamoylating agent such as cinnamoyl chloride in the presence of a solvent and subsequently precipitating the polyurethane-cinnamate from the solvent.

A polyurethane resin used as a preferred starting material is a blocked polyurethane prepolymer. This prepolymer was originally developed for formulation of magnet wire enamels, braid lacquers, sleeving varnishes, baking enamels, and so on. It has been used heretofore to produce coatings having superior abrasion resistance, high gloss, outstanding dielectric strength and ozone resistance, exceptional toughness, and low temperature flexibility. These resins are isocyanate-terminated polymers whose isocyanate groups have been treated with phenol to form a thermally unstable linkage and have then been heated to the point where the phenol was driven off, thus, enabling the isocyanate groups to react with a previously-added polyol system. The molecular weight of this blocked polyurethane prepolymer is about 8,000.

Other polyurethane resins may be used, including those which are prepared by reacting meta-tolylene-diamine (majority isomer) with phosgene to form meta-tolylene-diisocyanate and hydrogen chloride. Also, phosgene can be reacted with alcohols to form corresponding esters which may then be reacted with amines to produce the equivalent urethanes of the isocynate method. To obtain polymers, glycols are used to form bisesters and triols for branching through hydroxy compounds together with diamines for the final condensation.

Such polyurethane resins may be cinnamoylated by use of any of the presently available cinnamoylating compounds which contain cinnamoyl radicals, such as cinnamic acid, cinnamoyl chloride, and so on.

The polyurethane-cinnamate photopolymer of this invention has unique properties which distinguish from photopolymers previously known. The fact that the preferred polyurethane resin is a blocked isocyanate resin means that when it is cinnamoylated, it forms a blocked isocyanate polyurethane-cinnamate resin which can be easily applied to a support member to form a lithographic plate or a photoresist and can then be cured by heating to unblock the resin. Due to this unusual property, the maximum efficiency in coating operations can be obtained, so that ideal conditions for coating are readily available in the manufacturing plant. The unblocking can take place at any time by heating, whether prior to the coating, following the application of the coating, or prior to exposure and development, or even following exposure and development in the customer's shop. As a result, the blocked isocyanate polyurethane-cinnamate coatings of this invention can be easily handled in the manufacturing of photopolymer coated lithographic plates or photoresist for printed circuits with subsequent development in the user's shop.

Another important feature of the photopolymer of this invention is that it retains its abrasion resistance, toughness chemical resistance, hardness, and flexibility, once it has been heated to unblock the photopolymer. These qualities are very good in providing long-lasting plates.

We know of no solvent which dissolves the unblocked isocyanate polyurethane-cinnamate resin of this invention and therefore recommend that the polymer be dissolved and coated in the blocked state, followed, as said before, at any suitable time by the heating action which forms the very desirable unblocked final polymer.

As an example of a photopolymer embodying the principles of the invention, the polyurethane may be "TRANCO 8-A" polyurethane resin. This material is a clear, phenol-blocked, high-temperature urethane baking enamel which cures by reaction of isocyanate groups produced under the influence of heat with free hydroxyl groups already present.

| Typical Properties | |
|---|---|
| Color, Gardner | 1–3 |
| Viscosity, Gardner-Holdt | A–E |
| Weight % Solids | 50, plus or minus 1 |
| Solvent (50/50 by wt.) | Xylene and Ethylene glycol monoethyl ether acetate |
| Weight, Lbs. per gallon | 8.4 |

Film Application

Spray using conventional or electrostatic equipment. No further reduction is generally needed. Allow to air-dry 15–30 minutes (for best results). Bake 30 minutes at 150°C., (300°F.).

| Typical Film Properties | |
|---|---|
| Sward Hardness | 60 |
| Flexibility | Pass ⅛ inch bend |
| Impact Resistance | Greater than 100 inch pounds reverse impact |
| Sand Abrasion | Greater than 400 liters/mil |
| Tensile Strength | 5000 psi |
| Chemical Resistance: | |
| 20% Sodium Hydroxide | Excellent |
| 10% Hydrochloric Acid | Good |
| 10% Nitric Acid | Fair-film darkens |
| Toluene | Excellent |
| Methyl Isobutyl Ketone | Excellent |
| Ethyl Alcohol | Excellent |
| Ethyl Acetate | Excellent |
| Typical Analysis | |
| Volatiles (unblocking temp.) | 33% |
| Blocking Agent | Phenol |
| Available NCO (when unblocked) | 12.7% |
| (Based on the weight of the Tranco 8-A) | |

Tranco 8-A is completely unreactive at room temperature. This permits formulations of Tranco 8-A and polyethers, polyesters, castor oil, and polyamides that are room-temperature stable for several months.

Tranco 8-A unblocked at 285°F. At this temperature NCO groups become available for reaction with OH groups from polyethers, polyesters, castor oils, etc. The time of cure at this temperature is approximately 30 minutes. Temperatures may be increased and cure times shortened so that at 500°F., a cure time of less than five minutes will be realized. In the curing facilities provision must be made for carrying off the liberated blocking agent, phenol, which must be removed before Tranco 8-A will cure.

As a typical example, 10 grams of the above polyurethane resin and 50 cc. of cyclohexanone may be placed in a beaker and stirred 30 minutes at 60°C. to dissolve the resin. Then, 10 grams of cinnamoyl chloride are added and stirred for 15 minutes at 60°–95°C. to dissolve the cinnamoyl chloride. The heating of the reaction mixture is continued for one hour at 80°–155°C. The polyurethane-cinnamate reaction product is then precipitated and washed in methanol several times to remove cinnamoyl chloride (as in all of Examples 3 to 6) and dried.

This polyurethane-cinnamate photopolymer has been used successfully on ball grained plates to make presensitized negative-working polyurethane-cinnamate photopolymer lithographic printing plates.

The above polyurethane-cinnamate photopolymer has also been used to make a presensitized negative-working diazo-photopolymer plate by overcoating a negative-working diazo plate with polyurethane-cinnamate photopolymer. When given a ten-second exposure and developed as in Example 1, a press run of 20,000 copies can be obtained, in comparison with 14,000 for the control portion of the plate.

EXAMPLE 7

Two Other Photopolymers Used Over Diazo Resins

Other photopolymers have been used in the same manner as those of Examples 1–6. Some of them are proprietary materials not identifiable with certainty as to exact chemical composition. Thus, "Aroplaz 1081°," which is apparently a photopolymeric alkyd resin and also medium oil soya-tung composition, and "Dynachem" photoresist, a sensitized aryl allyl ester, have been used successfully over diazo resins. When given a ten-second exposure and developed as in previous examples, runs of 10,000 and 35,000 copies were obtained in press runs for the "Aroplaz" and "Dynachem" coated plates, in comparison with respective 10,000 and 15,000 copy runs for the uncoated diazo portions of their plates.

EXAMPLE 8

Series of Tests with Various Photopolymers at Various Thicknesses

Various coating thicknesses of various photopolymers have been tried, by dipping the negative-working diazo resin in solutions of photopolymers of various concentrations, draining, and drying. Also, plates of different grain smoothness have been tried. Many tests are summarized in the following table. To save space certain abbreviations and shorthand expressions are used in this table. Then abbreviations and expressions are explained as follows:

A. Plate Type

Smooth Means

A smooth aluminum sheet which has been cleaned of surface contamination by using a cleaning treatment which provides a minimum etch, such as trisodium phosphate-etch, followed by a suitable Desmut. (Example 1 gives an example of the preparation of such a smooth plate.) Photomicrographs indicate that 90–95 percent of the original smooth aluminum is still smooth following the metal cleaning and that 5–10 percent of the surface is pitted from the etch. This surface has been established without disrupting the original metal surface to any significant extent as is done using brush or ball graining techniques. In the following instances, the smooth plates used are subbased and presensitized with diazo resin as per Example 1.

Brush Means

A smooth aluminum sheet is cleaned by brushing the plate with rotating brushes, using a grit slurry containing quartz sand in tap water. The original metal surface is completely removed during the brush braining leaving a matte-finished aluminum with a grain depth of 5–6 microns. In the following instances, the brush grained plates were subbased and sensitized as were the plates in Example 1. Brush in this case thus means presensitized, brush grained plates.

Wipe-on Brush Means

The plate is brush grained and subbased as above; however, the diazo resin sensitizer is not applied to this plate at the manufacturing plant. The diazo resin may be wiped on the brush grained plate in the customer's shop. The plate is not presensitized. Wipe-on Brush in this case thus means a brush grained plate in which no diazo sensitizer has been applied.

Ball Means

A smooth aluminum sheet is cleaned by placing it in a ball grainer in which the entire original surface is removed by oscillating steel balls and grit slurry containing quartz sand and tap water over the top of the plate being ball grained. Ball graining gives the plates a matte-finished aluminum sheet with a grain depth of 8–9 microns. In the following instances, the ball grained plates are subbased and sensitized as are the plates in Example 1. Ball in this case thus means presensitized, ball grained plates.

Wipe-on Ball Means

The plate is ball grained and subbased as above; however, the diazo resin sensitizer is not applied to the plate at the manufacturing plant. The diazo resin may be wiped on the ball grained plate in the customer's shop. The plate is not presensitized. Wipe-on Ball in this case thus means a ball grained plate in which no diazo sensitizer has been applied.

B. Photopolymer

The photopolymers are indexed herein by the index numbers in the first column as to chemical type, the concentration in Xylene is given in the table. Thus, ".05 No. 1" means 0.05 percent of the photopolymer of Example 1. In No. 14, no xylene was used.

C. Catalyst

The catalyst, Michler's Ketone, is abbreviated MK.

D. Photospeed Exposure

The light source was a xenon arc lamp of 1000–1200 foot candles. In all cases the same standard lithographic emulsion-type developer was used.

E. Numbering

The arabic numeral identifies the complete plate, and letters identify plate areas. Thus, 1*a*, 1*b*, and 1*c* are all on the same plate. The plates were all aluminum.

As the preceding compilation of tests shows, the diazo-photopolymer plate system requires no special treatment of the plate metal, such as alpha alumina or graining. Also, the standard developer used illustrates that no special developer is required. The rapid speeds and long press runs are particularly impressive.

F. Special Comments on Plates 28–30 and 32

Bench tests showed that the polyvinyl alcohol of plates 28, 29 and 32 were slightly faster (solid step 4) when 50 percent cinnamoylated than when 75 percent cinnamoylated (solid step 3) or 100 percent cinnamoylated (solid step 3). The polyvinyl alcohol of plates 28, 29, and 32 (99 to 100 percent hydrolyzed), when 100 percent cinnamoylated, was slightly faster (solid step 3) than the 100 percent cinnamoylated polyvinyl alcohol of plate 30 (87 to 89 percent hydrolyzed, solid step 2). The run length decreased as polyvinyl alcohol cinnamoylation increased, and decreased for more completely hydrolyzed polyvinyl alcohol.

| | | | PHOTO-POLYMER (in Zylene) | | Photo- | BENCH TEST RESULTS | | | | PRESS TEST RESULTS | | |
|---|---|---|---|---|---|---|---|---|---|---|---|---|
| No. | Plate Type | Diazo | % Resin | % Catalyst | speed Exposure | Image | Back-ground | Step Solid | Wedge Visible | Image | Back-ground | Run Length |
| 1*a* | Smooth | Yes | 0 | 0 | 10 sec. | Good | Clean | 1 | 2 | No run | | |
| 1*b* | Smooth | No | .05 No. 1 | .005MK | 10 sec. | No Image – (Image lost during development) | | | | | | |
| 1*c* | Smooth | Yes | .05 No. 1 | .005MK | 10 sec. | Good (Spots) | OK Spots | 6 | 8 | — | — | — |
| 2*a* | Smooth | Yes | 0 | 0 | 10 sec. | Weak | Clean | 0 | 2 | — | — | — |
| 2*b* | Smooth | Yes | 2.5 No. 1 | .05MK | 10 sec. | Good | Clean | 5 | 7 | Good | Clean | 35,000 |
| 3*a* | Brush | Yes | 0 | 0 | 10 sec. | Good | Clean | 1 | 2 | No run | | |
| 3*b* | Brush | Yes | 2.5 No. 1 | .05MK | 10 sec. | Good | Clean | 6 | 9 | — | — | — |
| 4 | (Wipe-on Brush) | No | 2 No. 1 | .2MK | 20 min. | Good | Clean | — | — | No run | | |
| 5*a* | Smooth | Yes | — | — | 10 sec. | Good | OK | 1 | 3 | Good | OK | 5,000 |
| 5*b* | Smooth | Yes | .01 No. 1 | .001MK | 10 sec. | Good | OK | 3 | 7 | OK | OK (scum?) | 16,000 |
| 6*a* | Smooth | Yes | — | — | 10 sec. | Weak | Clean | 0 | 1 | — | — | — |
| 6*b* | Smooth | Yes | 0.25 No. 1 | None | 10 sec. | Good | Clean | 3 | 4 | OK | OK (scum) | 18,000 |
| 7*a* | Smooth | Yes | 0 | 0 | 10 sec. | Weak | Clean | 1 | 2 | Weak | Clean | 5,000 |
| 7*b* | Smooth | Yes | .05 Aroplaz | .005MK | 10 sec. | Good | Clean | 2 | 3 | Good | Clean | 10,000 |
| 8*a* | Smooth | Yes | 0 | 0 | 2 min. | Weak | Clean | 0 | 1 | Good | Clean | 9,000 |

Continued

| No. | Plate Type | Diazo | PHOTO-POLYMER % Resin | % Catalyst | Photo-speed Exposure | BENCH TEST RESULTS Image | Back-Ground | Step Solid | Wedge Visible | PRESS TEST RESULTS Image | Back-Ground | Run Length |
|---|---|---|---|---|---|---|---|---|---|---|---|---|
| 8b | Smooth | Yes | 5 No. 1 | .5MK | 10 sec. | OK | Clean | 2 | 3 | Pinholes | OK | 5,000 |
| 9 | Ball | Yes | 5 No. 1 | .5MK | 10 sec. | Fair | Clean | 4 | 7 | OK | OK | 100,000+ |
| 10a | Brush | Yes | 0 | 0 | 2 min. | Good | Clean | — | — | Good | Clean | 25,000 |
| 10b | Brush | Yes | 5 No. 1 | .5MK | 10 sec. | Good | Clean | 3 | 4 | Good | Clean | 67,000+ |
| 11a | Smooth | Yes | 0 | 0 | 2 min. | Good | Clean | — | — | Good | Clean | 8,000 |
| 11b | Smooth | Yes | .5 No. 1 | .05MK | 10 sec. | Good | Clean | 6 | 10 | Good | Clean | 20,000 |
| 12a | Smooth | Yes | 0 | 0 | 2 min. | Good | Clean | — | — | Good | Clean | 10,000 |
| 12b | Smooth | Yes | 1 Aroplaz | .05MK | 10 sec. | Good | Clean | 3 | 6 | Good | Clean | 10,000 |
| 13a | Smooth | Yes | 0 | 0 | 2 min. | Good | Clean | — | — | Good | Clean | 10,000 |
| 13b | Smooth | Yes | 2.5 No. 3 | — | 10 sec. | Good | Clean | 6 | 7 | Good | Clean | 30,000 |
| 14a | Smooth | Yes | 0 | 0 | 2 min. | Good | Clean | — | — | Good | Clean | 15,000 |
| 14b | Smooth | Yes | No. 2 | 0 | 10 sec. | Good | Clean | 4 | 5 | Good | Clean | 70,000 |
| 15a | (Wipe-on Ball) | No | 5 No. 3 | .5MK | 10 min. | Fair | Clean | 1 | 2 | Fair | Clean | 1,000 |
| 15b | (Wipe-on Brush) | No | 5 No. 3 | .5MK | 20 min. | (Mottled) Fair | Clean | 1 | 2 | Fair | Clean | 1,000 |
| 16 | (Wipe-on Ball) | None | No. 4 | — | 10 min. | (Mottled) Good | Clean | 2 | 3 | Good | Clean | 47,000 |
| 17a | Ball | Yes | 0 | 0 | 2 min. | Good | Clean | — | — | Blind | Clean | 26,000 |
| 17b | Ball | Yes | No. 4 | 0 | 10 sec. | Good | Clean | 1 | 3 | Blind | Clean | 20,000 |
| 18a | Smooth | Yes | 0 | 0 | 2 min. | Good | Clean | — | — | Good | Clean | 10,000 |
| 18b | Smooth | Yes | No. 4 | 0 | 10 sec. | Weak | Clean | 1 | 2 | Weak | Clean | 10,000 |
| 18c | Smooth | Yes | No. 4 | 0 | 30 sec. (2 min.) | Good | Clean | — | — | Good | Clean | 20,000 (25,000) |
| 19a | Smooth | Yes | 0 | 0 | 2 min. | Good | Clean | — | — | Good | Clean | 9,000 |
| 19b | Smooth | Yes | 2.5 No. 3 | 0 | 10 sec. | Mottled | Clean | 3 | 4 | Mottled | Clean | 14,000 |
| 19c | Smooth | Yes | 2.5 No. 3 | 0 | 30 sec. (2 min.) | Good | Clean | — | — | Good | Clean | 19,000 (26,000) |
| 20a | Brush | Yes | 0 | 0 | 2 min. | Good | Clean | — | — | Good | Clean | 10,000 |
| 20b | Brush | Yes | No. 3 | 0 | 10 sec. | Good | Clean | 4 | 5 | Good | Clean | 47,000 |
| 21a | Ball | Yes | 0 | 0 | 2 min. | Good | Clean | — | — | Blind | Clean | 47,000+ |
| 21b | Ball | Yes | No. 3 | MK | 10 sec. | Good | Clean | 3 | 5 | Blind | Clean | 47,000+ |
| 22a | Smooth | Yes | 0 | 0 | 2 min. | Good | Clean | — | — | Good | Clean | 15,000 |
| 22b | Smooth | Yes | No. 4 | 0 | 10 sec. | OK (Spots) | OK (Spots) | 3 | 4 | OK (Spots) | OK (Spots) | 42,000 |
| 23 | Wipe-on Ball | No | 5 No. 5 | .5MK | 10 min. | Weak | Clean | — | — | — | — | — |
| 24a | Smooth | Yes | 0 | 0 | 10 sec. | Weak | Clean | 0 | 1 | — | — | — |
| 24b | Smooth | Yes | 5 No. 5 | .5MK | 10 sec. (2 min.) | OK | Clean | 1 | 2 | OK | Clean | 6,000 |
| 25a | Ball | Yes | 0 | 0 | 60 sec. | Good | Clean | 5 | 7 | Good | Clean | 21,000 |
| 25b | Ball | Yes | 5 No. 5 | 0 | 60 sec. | Good | Clean | 6 | 9 | Good | Clean | 21,000 |
| 26 | Wipe-on Ball | No. | 6 | | 10 min. | Fair (Weak areas) | Clean | 3 | 6 | Image Lost! at Start | | |
| 27a | Smooth | Yes | — | — | 30 sec. | Good | Clean | 2 | 4 | Good | Clean | 14,000 |
| 27b | Smooth | Yes | No. 6 in zylene | — | 30 sec. | Good | Clean | 3 | 5 | Good | Clean | 20,000 |
| 28a | Smooth | Yes | 0 | 0 | 2 min. | Good | Clean | — | — | Good | Clean | 16,000 |
| 28b | Smooth | Yes | 5% Polyvinyl Alcohol 99 to 100% hydrolyzed. 50% Cinnamoylated in cyclohexanone. | 0.5 | 2 min. | Good | Clean | — | — | Good | Clean | 100,000 |
| 28c | Smooth | Yes | Same as 29 *b* | 0.5 | 30 sec. | Good | Clean | — | — | Good | Clean | 100,000 |
| 28d | Smooth | Yes | Same as 29 *b* | 0.5 | 10 sec. | Good | Clean | 5 | 6 | Good | Clean | 110,000 |
| 29a | Smooth | Yes | 0 | 0 | 2 min. | Good | Clean | — | — | Good | Clean | 15,000 |
| 29b | Smooth | Yes | 5% Polyvinyl Alcohol 99 to 100% hydrolyzed 100% Cinnamoylated in cyclohexanone | 0.5 | 2 min. | Good | Clean | — | — | Good | Clean | 100,000 |
| 29c | Smooth | Yes | Same as 30 *b* | 0.5 | 30 sec. | Good | Clean | — | — | Good | Clean | 40,000 |
| 29d | Smooth | Yes | Same as 30 *b* | 0.5 | 10 sec. | Good | Clean | 3 | 4 | Good | Clean | 30,000 |
| 30a | Smooth | Yes | 0 | 0 | 2 min. | Good | Clean | — | — | Good | Clean | 14,000 |
| 30b | Smooth | Yes | 5% Polyvinyl Alcohol 87 to 89% hydrolyzed 100% Cinnamoylated in cyclohexanone | 0.5 | 2 min. | Good | Clean | — | — | Good | Clean | 100,000 |
| 30c | Smooth | Yes | Same as 31 *b* | 0.5 | 30 sec. | Good | Clean | — | — | Good | Clean | 80,000 |
| 30d | Smooth | Yes | Same as 31 *b* | 0.5 | 10 sec. | Good | Clean | 3 | 4 | Good | Clean | 100,000 |
| 31a | Smooth | Yes | 0 | 0 | 2 min. | Good | Clean | — | — | Good | Clean | 14,000 |
| 31b | Smooth | Yes | 5% No. 1 | 0.5 | 2 min. | Good | Clean | | | Good | Clean | 110,000 |
| 31c | Smooth | Yes | 5% No. 1 | 0.5 | 30 sec. | Good | Clean | — | — | Good | Clean | 60,000 |
| 31d | Smooth | Yes | 5% No. 1 | 0.5 | 10 sec. | Good | Clean | 3 | 4 | Good | Clean | 100,000 |
| 32a | Smooth | Yes | 0 | 0 | 2 min. | Good | Clean | — | — | Good | Clean | 12,000 |
| 32b | Smooth | Yes | 5% Polyvinyl Alcohol 99 to 100% hydrolyzed 75% Cinnamoylated in cyclohexanone | 0.5 | 2 min. | Good | Clean | — | — | Good | Clean | 80,000 |
| 32c | Smooth | Yes | Same as 33 *b* | 0.5 | 30 sec. | Good | Clean | — | — | Good | Clean | 70,000 |

Continued

| No. | Plate Type | Diazo | PHOTO-POLYMER % Resin | % Catalyst | Photo-speed Exposure | BENCH TEST RESULTS Image | Back-ground | Step Solid | Wedge Visible | PRESS TEST RESULTS Image | Back-ground | Run Length |
|---|---|---|---|---|---|---|---|---|---|---|---|---|
| 32*d* | Smooth | Yes | Same as 33 *b* | 0.5 | 10 sec. | Good | Clean | 3 | 4 | Good | Clean | 80,000 |
| 33*a* | Smooth | Yes | 0 | 0 | 2 min. | Good | Clean | — | — | Good | Clean | 13,000 |
| 33*b* | Smooth | Yes | 1% Kodak Thin Film Resist in xylene | — | 2 min. | Good | Some scum | — | — | Good | Some scum | 20,000 |
| 33*c* | Smooth | Yes | Same as 34 *b* | — | 30 sec. | Good | Some scum | — | — | Good | Some scum | 20,000 |
| 33*d* | Smooth | Yes | Same as 34 *b* | — | 10 sec. | Good | Some scum | 1 | 3 | Good | Some scum | 20,000 |
| 34*a* | Smooth | Yes | 0 | 0 | 2 min. | Good | Clean | — | — | Good | Clean | 13,000 |
| 34*b* | Smooth | Yes | 1% Kodak Metal Etch Resist in xylene | — | 2 min. | Good | Some scum | — | — | Good | Some scum | 20,000 |
| 34*c* | Smooth | Yes | Same as 35 *b* | — | 30 sec. | Good | Some scum | — | — | Good | Some scum | 20,000 |
| 34*d* | Smooth | Yes | Same as 35 *b* | — | 10 sec. | Good | Some scum | 2 | 4 | Good | Some scum | 20,000 |
| 35*a* | Smooth | Yes | 0 | 0 | 2 min. | Good | Clean | — | — | Good | Clean | 16,000 |
| 35*b* | Smooth | Yes | 1% No. 2 in xylene | — | 2 min. | Good | Clean | — | — | Good | Clean | 40,000 |
| 35*c* | Smooth | Yes | Same as 36 *b* | — | 30 sec. | Good | Clean | — | — | Good | Clean | 30,000 |
| 35*d* | Smooth | Yes | Same as 36 *b* | — | 10 sec. | Good | Clean | 2 | 3 | Good | Clean | 50,000 |

EXAMPLE 9

High-Speed Diazo-Photopolymers Used as a Photoresist for Printed Circuits

The high-speed diazo-photopolymer photoresist, coated on a copper circuit board has a photospeed approximately double the photospeed of the photopolymer photoresist alone.

To make a photoresist according to this invention, a copper printed circuit board (copper laminated to a base of fabric and phenolic) is cleaned with a scouring powder and distilled water brushed to remove the dirt from the board, and wiped dry. The cleaned copper board is then coated overall with 2.5 percent phenoxycinnamate photopolymer (cf., Example 1) + 0.25 percent Michler's Ketone in xylene. The coating is flowed on to the board and the board drained dry. Next, one-half of the polymer coated circuit board is coated with 3 percent Diazo Resin No. 4 (Industrial Dystuff Co.) in 32 percent n-propanol-64 percent distilled water and is air dried. The diazo resin is applied on top of the photopolymer-coated copper printed circuit board, because the copper reacts with the diazo resin when diazo resin is applied directly to the copper board without suitable subbase for protection. The photopolymer has been found to be a suitable subbase, while also giving a great increase in photospeed.

The board is then exposed for two minutes to a 1000–1200 foot candle xenon arc lamp through a transparency and two Kodak No. 2 Photographic Step Tablets (one on the section coated only with polymer and one on the section coated first with polymer and then diazo resin). The exposed board is developed for one minute in xylene, is washed with water, and is air dried. After development, the image and background areas of both sections are good; however, the step wedge shows that the photopolymer-only section was Solid = 5, Visible = 7, while the section having the polymer overcoated with diazo resin was Solid = 7, Visible = 9.

The developed plate was next etched in a 42° Be ferric chloride bath at room temperature for 30 minutes. Both the photopolymer alone and the photopolymer with diazo on top resisted the etching batch. After etching, the step wedge of the photopolymer-only section was Solid = 5, Visible = 7, while the section where the photopolymer was overcoated with diazo resin was Solid = 7, Visable = 9. Thus, the photospeed is doubled by overcoating the photopolymer with the diazo resin. Other concentrations, etc., may further increase the photospeed of the diazo-photopolymer photoresists for use on copper circuit boards.

EXAMPLE 10

Photoresist Plate Developed by Emulsion

A plate is made as in Example 9, except that the circuit board is emulsion developed instead of being developed in xylene. The image was rubbed off, both in the photopolymer-only area and in the area where the photopolymer was overcoated with diazo resin.

EXAMPLE 11

Photoresist Plate Having Subbase and Having Photopolymer Over the Diazo Resin

A copper circuit board is cleaned with a commercial cleansing powder, distilled water, and a brush, and given a water wash. Sodium silicate "Plate Cleaner" is applied and then the board is water washed.

The clean plate has a subbase and sensitizer applied by rollers after washing the plate with distilled water. The subbase is a water solution of 0.75 percent Amres 212 (Pacific Resins Co.), followed by a water solution of 1.25 percent Image Bath Concentrate (Acidified Calcium Phytate — Corn Products, Inc.) Then the sensitizer, 0.3 percent Diazo Resin No. 4 solution (Fairmount Chemical Co.) is applied, and the plate is dried. One-half of the diazo-coated printed circuit board is then coated with 2.5 percent phenoxy-cinnamate photopolymer + 0.25 percent Michler's Ketone in xylene, and the board is air dried.

The board is exposed for two minutes to a 1000-1200 foot candle xenon arc lamp through two Kodak No. 2 Photographic Step Tablets (one on the diazo-only section and one on the diazo-photopolymer section). Then the plate is emulsion developed.

Results After Development:

| Step Wedge = | Solid | Visible |
|---|---|---|
| The diazo control section is weak. | 0 | 0 |
| The diazo-photopolymer section is good. | 8 | 10 |

The step wedge here indicates that photospeed of the diazo-photopolymer section is 10 to 20 times that of the diazo-only section.

The developed plate was then etched in a 42° Be ferric chloride bath at room temperature for 30 minutes. The diazo control section is lost during etching, but the diazo-photopolymer section resists the etching action.

EXAMPLE 12

Various Photoresist Plates of This Invention.

The plates in this example were all prepared in the same manner as in Example 11, except that the use of the sodium silicate "Plate Cleaner" was omitted, and except that the diazo resin was overcoated as follows: base is 0.075 percent Amres 212 (Pacific Resins Co.) followed by 1.25 percent Image Bath Concentrate (Acidified Calcium Phytate — Corn Products, Inc.) Then, 0.3% Diazo Resin No. 4 (Fairmount Chemical Co.) is applied as a sensitizer, and the plate is air dried.

One-half of the diazo-coated nameplate is then coated with the photopolymers listed below, and one-half is kept as a diazo control section. The plates are each exposed one minute to a 1000–1200 foot candle xenon arc lamp through two Kodak No. 2 Photographic Step Tablets (one on the diazo-only section and one on the diazo-photopolymer section). The exposed plates are emulsion developed and checked as to the solid and visible effects. Then the plates are etched in 10 percent

| Plate No. | One-Half Photopolymer Overcoat | Michler's Ketone | AFTER DEVELOPMENT Image | Back-ground | Step Wedge Solid | Step Wedge Visible | After Etching |
|---|---|---|---|---|---|---|---|
| 36a | 2.5% Phenoxy-Cinnamate in Xylene | 0.25% | Good | Satisfactory | 6 | 8 | Good |
| 36b | Diazo Control | | Weak | Scum | ? | ? Scum | Weak |
| 37a | Kodak Photo Resist | — | Good | Satisfactory | 21? | 21? | Satisfactory |
| 37b | Diazo Control | — | Weak | Scum | ? | ? Scum | Weak |

| Plate No. | One-Half Photopolymer Overcoat | Michler's Ketone | AFTER DEVELOPMENT: Solid | AFTER DEVELOPMENT: Visible | AFTER ETCHING: Solid | AFTER ETCHING: Visible |
|---|---|---|---|---|---|---|
| 38a | 2.5% VYHH-Cinnamate Photopolymer (in 50—50 Xylene-Methyl Amyl Acetate) | 0.25% | 6 | 7 | 6 | 7 |
| 38b | Diazo Control Section | — | 3 | 4 | 3 | 4 |
| 39a | 10% Polyurethane-Cinnamate (in Cyclohexanone) | 1.0% | 5 | 7 | 4 | 5 |
| 39b | Diazo Control Section | — | 3 | 5 | 4 | 5 |
| 40a | ATLAC-Cinnamate (in cyclohexane) | 0.5% | 5 | 7 | 4 | 5 |

This example shows that the diazo-photopolymer photoresists made by overcoating a subbased diazo-sensitized copper circuit board with photopolymers can be emulsion developed; however, photopolymer plates coated on copper circuit boards without a subbase and diazo sensitizer, such as in Example 10, cannot be emuslion developed even if the photopolymer alone is overcoated with diazo resin. Either the diazo-photopolymer is better bonded when coated on the copper board than the photopolymer alone, or the diazo-photopolymer light reaction product is cross-linked to a greater extent than the photopolymer alone, or a combination of both effects occurs, causing the diazo-photopolymer copper boards to be more resistant to the wiping action during emulsion development than the photopolymer alone.

EXAMPLE 13

High-Speed Diazo-Photopolymers Used as a Photoresist for Making Nameplates

The high-speed diazo-photopolymers used as a photoresist for making anodized aluminum nameplates have photospeeds eight times faster than photopolymers used alone and six times faster than the diazo only, and they have an additional advantage over photopolymers used alone in that they can be emulsion developed.

A subbase is applied to red anodized aluminum, with rollers after first washing with distilled water. The sub- sodium hydroxide in distilled water in a tray until the red anodizing is removed in the areas unprotected by the photoresist, thereby exposing the raw aluminum; however, the photoresist-protected areas remain red, providing suitable contrast to be used as a metal nameplate.

EXAMPLE 14

Photopolymer on Aluminum Without Prior Subbase and Without Diazo Resin Undercoat A photopolymer overcoat is applied to a red anodized aluminum nameplate without a prior subbase and without a diazo sensitizer by dip-coating and air drying, using 2.5 percent phenoxy-cinnamate photopolymer + 0.25 percent Michler's Ketone in xylene (as used above in Example 1). The plate is then exposed one minute to a 1000–1200 foot candle xenon arc through a negative transparency and is emulsion developed.

The photopolymer image was completely lost during development. Thus, the anodized aluminum nameplates using a photopolymer photoresist only, cannot be emulsion developed; however, anodized aluminum nameplates produced by using a diazo-photopolymer photoresist can be emulsion developed.

EXAMPLE 15

The Plate of Example 14 Developed in Xylene

A plate made as in Example 14 and exposed in the same manner and for the same time is developed in a tray of xylene for one minute and washed with tap water. Then the plate is etched in 10 percent sodium hydroxide in distilled water, as in Example 13 above.

| Results After Etching: | | |
|---|---|---|
| Image= Good | Step Wedge Solid = 2 | Visible= 5 |

The diazo-photopolymer photoresist used to make red anodized aluminum nameplates, as in Example 13, Plate No. 33, resulted after etching in a step wedge of Solid = 8, Visible = 9, after etching; the same photopolymer photoresist when used alone in Example 15 resulted in a step wedge of Solid = 2, Visible = 5. Therefore, the diazo-hotopolymer photoresist speed is 8.4 times faster than the photopolymer photoresist alone, and is 5.8 times faster than the diazo alone.

EXAMPLE 16

Prior art relied on incorporation of various photosensitizers (Michler's Ketone, nitro aryl compounds, anthrone, benzanthrone, quinones, benzophenones, etc.) to impart enough speed to various cinnamate-containing compounds to make them usable as photoresists. A surprising and significant feature of the present invention is that omission of such photosensitizers increases the speed of lithographic plates of this invention, wherein the photopolymer is coated over a diazo resin.

Three plats were prepared, each starting with identical diazo-presensitized lithographic plates. Polyvinyl alcohol (99 to 100 percent hydrolyzed) was 100 percent cinnamoylated and dissolved in cyclohexanone to give a 5 percent solution. For one plate, no photosensitizer was added; for a second plate, 0.5 percent 1-nitronaphthalene photosensitizer was added; and for a third plate, 0.5 percent Michler's Ketone photosensitizer was added. In each instance, one-half of the diazo-presensitized lithographic plate was coated and dried. Then each plate was exposed for ten seconds to 1000–1200 foot-candle Xenon arc light through a Kodak No. 2 Photographic Step Tablet, and subsequently emulsion-developed and desensitized in identical manner. The results were as follows:

| | Image | Background | Step-Wedge Solid |
|---|---|---|---|
| No photosensitizer | good | clean | 5 |
| 1-nitronaphthalene photosensitizer | good | clean | 3 |
| Michler Ketone photosensitizer | good | clean | 2 |
| control sections (no coating) | weak | clean | 0–1 |

What is claimed is:

1. A high-speed presensitized plate for lithography or photoresist etching comprising in combination, a plate base, a sub-base coating over the plate base, a light sensitive diazo resin condensation product of an aldehyde and a diazonium compound layer over the sub-base coating and a phenoxy cinnamate photopolymer coating over the diazo resin layer.

2. A high-speed diazo-photopolymer photoresist plate comprising in combination, a plate base, a phenoxy-cinnamate photopolymer coating over the plate base, and a light sensitive diazo resin condensation product of an aldehyde and a diazonium compound layer over the photopolymer coating.

* * * * *